United States Patent
Kesper

(10) Patent No.: US 10,843,453 B2
(45) Date of Patent: Nov. 24, 2020

(54) COMPOSITE PANEL WITH BARRIER LAYER AND METHOD FOR MANUFACTURING A LETTERPRESS PLATE

(71) Applicant: AKK GmbH, Krefeld (DE)

(72) Inventor: Peter Kesper, Krefeld (DE)

(73) Assignee: AKK GmbH, Krefeld (DE)

( * ) Notice: Subject to any disclaimer, the term of this patent is extended or adjusted under 35 U.S.C. 154(b) by 0 days.

(21) Appl. No.: 16/340,427

(22) PCT Filed: Oct. 9, 2017

(86) PCT No.: PCT/EP2017/075663
§ 371 (c)(1),
(2) Date: Apr. 9, 2019

(87) PCT Pub. No.: WO2018/069242
PCT Pub. Date: Apr. 19, 2018

(65) Prior Publication Data
US 2019/0224957 A1    Jul. 25, 2019

(30) Foreign Application Priority Data

Oct. 10, 2016  (EP) ..................... 16193101
Sep. 7, 2017  (EP) ..................... 17189967

(51) Int. Cl.
*B41M 1/00* (2006.01)
*B41C 1/00* (2006.01)
(Continued)

(52) U.S. Cl.
CPC .............. *B41C 1/003* (2013.01); *B41C 1/00* (2013.01); *B41M 1/00* (2013.01); *G03F 7/092* (2013.01);
(Continued)

(58) Field of Classification Search
CPC ........................................ G03F 7/00
See application file for complete search history.

(56) References Cited

U.S. PATENT DOCUMENTS 4,164,422 A * 8/1979 Okai .................. G03F 7/0752
430/272.1
6,020,108 A    2/2000 Goffing et al.
(Continued)

FOREIGN PATENT DOCUMENTS

DE    19536808 A1    4/1997
EP    0848296 A1    6/1998
(Continued)

OTHER PUBLICATIONS

Rompp, Chemie Lexikon, 7th edition, 1973, Franckh'sche Verlagshandlung, W. Keller & Co., Germany (cited in specification).
(Continued)

*Primary Examiner* — Chanceity N Robinson
(74) *Attorney, Agent, or Firm* — The Webb Law Firm

(57) ABSTRACT

A composite panel for use in the manufacture of a letterpress plate has a carrier layer, with at least one photo layer which can be structured via electromagnetic radiation in a wavelength range. The photo layer is arranged on the carrier layer. The task of proposing a composite panel use in the manufacture of a letterpress plate is achieved by the fact that a barrier layer is provided. The barrier layer is arranged on the side of the photo layer opposite to the carrier layer. The barrier layer is essentially transparent in the wavelength range in which the photo layer can be structured. The present disclosure concerns a process for manufacturing a letterpress plate using at least one composite panel and a process for manufacturing a composite plate in accordance with the invention. The invention concerns the use of a composite material in a composite panel for a letterpress plate.

6 Claims, 3 Drawing Sheets

(51) Int. Cl.
*G03F 7/09* (2006.01)
*G03F 7/20* (2006.01)
*B41M 1/04* (2006.01)

(52) U.S. Cl.
CPC ............. *G03F 7/2016* (2013.01); *B41M 1/04* (2013.01); *B41P 2200/12* (2013.01)

(56) References Cited

U.S. PATENT DOCUMENTS

2004/0081908 A1* 4/2004 Shimazu ................ G03F 1/68
430/152
2007/0212647 A1 9/2007 Takagi et al.
2016/0229172 A1 8/2016 Stebani et al.

FOREIGN PATENT DOCUMENTS

| EP | 1072953 A1 | 1/2001 |
| EP | 2950146 A1 | 12/2015 |
| GB | 2023861 A | 1/1980 |
| JP | 6043660 A | 3/1985 |
| JP | 200963873 A | 3/2009 |
| JP | 4332865 B1 | 9/2009 |
| WO | 2016188981 A1 | 12/2016 |

OTHER PUBLICATIONS

Ullmann's Encyklopadie der technischen Chemie, 4th edition, 1981, Verlag Chemie, Germany (cited in specification).

* cited by examiner

COMPOSITE PANEL WITH BARRIER LAYER AND METHOD FOR MANUFACTURING A LETTERPRESS PLATE

CROSS-REFERENCE TO RELATED APPLICATIONS

This application is the United States national phase of International Application No. PCT/EP2017/075663 filed Oct. 9, 2017, and claims priority to European Patent Application No. 16193101.9 filed Oct. 10, 2016, and European Patent Application No. 17189967.7 filed Sep. 7, 2017, the disclosures of which are hereby incorporated by reference in their entirety.

BACKGROUND OF THE INVENTION

The invention concerns a composite panel for use in the manufacture of a letterpress plate, in particular a flexographic printing plate, with a carrier layer, with at least one photo layer, which can be structured via electromagnetic radiation in a wavelength range, in which the photo layer is arranged on the carrier layer. Further, the invention concerns a process for the manufacture of a letterpress plate using at least one composite panel and a process for the manufacture of a composite according to the invention. Finally, the invention concerns the use of a composite material in a composite panel for a letterpress plate.

Letterpress plates, for example flexographic printing plates, are relief plates in which the imaging sections are elevated in relation to a base area. For the manufacture of letterpress plates, in particular composite panels, e.g. layered composite panels, are used, which are structured for letterpress.

Such composite panels include in particular a carrier layer and at least one photo layer. The carrier layer, for example, serves to mechanically stabilize the composite panel. The photo layer exhibits a material which changes its properties under the influence of electromagnetic radiation. If the photo layer is exposed selectively, the solubility, curing behaviour and/or adhesion properties of the sections of the photo layer affected by the selective exposure, for example, change. For example, by a chemical treatment afterwards the sections of higher solubility, lower hardness and/or lower adhesion are selectively removed to obtain a relief structure. Selective exposure is usually achieved using a mask material, in which the mask material covers the portions of the photo layer, that are not to be exposed, to the incoming radiation.

It is known from practice that a photographic film is applied to the photo layer as mask material. The photographic film can be selectively exposed and developed using known methods, so that a partially transparent, partially opaque mask layer is formed on the photographic layer. Corresponding procedures are referred to as analog procedures, for example. However, the resulting quality of the surface structure and the resolution of the letterpress plate are improvable. The availability of photographic films has also declined in recent years, so that the use of photographic films for the production of letterpress plates is no longer widespread.

An alternative to the use of photographic films as mask material is the application of an opaque mask layer (black mask), which is selectively removed by optical methods such as laser ablation. Laser ablation is usually carried out using computer-aided methods and is referred to as a digital method or direct-to-plate method, for example. With the selective removal of the mask material, a structured mask remains, which only partially covers the photo layer. The processes based on ablation of a mask material, however, are complex in terms of equipment and do not normally permit high process speeds.

It is also common for the composite panels to be provided with a protective layer for use in the manufacture of letterpress plates. As a protective layer serves for example plastic films, which cover the photo layer in order to protect the photo layer from mechanical influences such as scratches and from impurities such as dust. The protective layers, however, do not allow process-safe and high-quality selective exposure of the photo layer and are intended to be removed before selective exposure and especially before application of the mask material.

The present invention is based on the task of proposing a composite panel for use in the manufacture of a letterpress plate and a process for the manufacture of a letterpress plate, which reduce the above-mentioned disadvantages from the state of the art and in particular enable effective manufacture of the letterpress plate with good resolution. Furthermore, a process for the manufacture of a composite panel in accordance with the invention and the use of a composite material in a composite panel for a letterpress plate for solving this task are mentioned.

SUMMARY OF THE INVENTION

According to the first teaching of the invention, said task concerning a composite panel is solved by providing a barrier layer, in which the barrier layer is arranged on the side of the photo layer opposite to the carrier layer, the barrier layer being substantially transparent in the wavelength range in which the photo layer is structurable and at least one mask material is arranged on the barrier layer, in which the mask material includes diazo compounds and the mask material is applied by lamination.

The composite panel is in particular a layered composite panel comprising a number of layers which are connected to each other via their extension surfaces. The individual layers, in particular the carrier layer, the photo layer and the barrier layer, are in particular continuous layers, i.e. the layers are flat and have no recesses. In particular, individual or all layers are firmly bonded together, for example by adhesion and/or material bonding.

The carrier layer serves in particular to mechanically stabilize the composite panel and the letterpress plate made from it. The carrier layer may be designed to provide protection against mechanical stresses and to provide the composite panel with mechanical properties appropriate to the intended printing process and printing device. For example, the carrier layer includes or consists of at least one of the following materials: cellulosic materials, paper, paperboard, plastics and/or metal. In particular, materials based on polymers are intended, for example such as polyester, polystyrene, polyolefin and/or polyamide. In particular, the carrier layer is made of or consists of polyethylene terephthalate. The carrier layer may also be based on or consist of polyvinyl, in particular at least one water-soluble polyvinyl.

The at least one photo layer is structurable by electromagnetic radiation in a wavelength range, for example according to the principle of a photoresist. For example, the solubility, hardness, adhesion and/or curing properties of the material of the photo layer are influenced by radiation in such a wavelength range that selective removal of the photo layer is possible after exposure and, in particular, subsequent curing or development. For example, the solubility decreases due to exposure in this wavelength range, allowing the unexposed portions of the photo layer to be dissolved or removed. Solubility can also increase due to exposure in this wavelength range, so that a solution can predominantly remove the exposed areas. The photo layer can therefore have positive or negative exposure characteristics.

The wavelength range of the electromagnetic radiation used to structure the photo layer may be within the visible range and/or outside the visible range. In particular, the wavelength range lies in the ultraviolet, i.e. within a range from 100 nm to 380 nm, for example, and/or in the violet visible range, i.e. within a range from 380 nm to 425 nm, for example.

The photo layer may be based in particular on photopolymers and/or may be in solid form. Corresponding photopolymers and methods for the selective structuring of photo layers are familiar to the expert from his expertise and are described, for example, in *Ullmann's Encyklopädie der technischen Chemie,* 4th edition, Verlag Chemie (1981).

The photo layer is arranged on the carrier layer. The photo layer can be arranged directly on the carrier layer, i.e. in contact with the carrier layer. Alternatively, one or more intermediate layers may be disposed between the carrier layer and the photo layer, in particular at least one additional adhesion layer adapted to provide the binding between the carrier layer and the photo layer.

A barrier layer is provided, in which the barrier layer is arranged on the side of the photo layer opposite to the carrier layer. In particular, the barrier layer is arranged directly on the photo layer, i.e. the barrier layer is in contact with the photo layer. The barrier layer is essentially transparent in the wavelength range in which the photo layer can be structured.

Essentially transparent means that a large part of the radiation intensity in the wavelength range concerned can penetrate through the barrier layer, in particular at least 50%, preferably at least 75%, further preferably at least 95% of the incident intensity can penetrate through the barrier layer. The layer thickness is the mean thickness of the layer perpendicular to the largest area of the layer.

The barrier layer serves in particular as a diffusion barrier layer, in which the barrier layer is intended to prevent the photo layer from coming into contact with the surrounding atmosphere. The barrier layer is therefore preferably provided as a continuous or flat layer on the photo layer and covers the photo layer either partially or completely on one surface.

It has been found that the quality and resolution of the printing plate manufactured from the composite panel can be improved via the barrier layer. The barrier layer remains on the photo layer during an exposure of the photo layer and possibly during an exposure of a mask material. Whereas protective layers on the photographic layer usually have to be removed from the state of the art before exposure, the retention of the barrier layer of the present invention is made possible in particular by the preferably small layer thickness of less than 20 µm, in which the refraction of the radiation used to expose the photo layer at the barrier layer causes only minor quality losses. During the photochemical reaction of the photo layer triggered by the exposure, the influence of the surrounding atmosphere is significantly reduced by the barrier layer, which leads to a significant increase in the quality of the structured surface of the photo layer. Without being bound to a certain theory, it is assumed that in the state of the art a reaction of the photo layer with oxygen is primarily responsible for a loss of quality of the structured surface of the photo layer, which can be reduced by the invented barrier layer. At the same time, it was found that the low layer thickness of the barrier layer, in particular the refractive effects of the barrier layer, which have a negative influence on dissolution, are reduced to such an extent that the quality of the letterpress plates produced is improved as a result.

In particular, the barrier layer has or consists of polymer-based materials. Such polymers include, for example, polyesters, polystyrene, polyolefins and/or polyamides. In particular, the barrier layer is or consists of polyethylene terephthalate. The barrier layer may also be or consist of polyvinyl, in particular at least one water-soluble polyvinyl. Other materials, which provide a sufficient diffusion barrier of the barrier layer and are essentially transparent in the relevant wavelength range, are also conceivable. In particular, the material of the barrier layer is different from the material of the photo layer and/or the carrier layer.

The total thickness of the composite panel is, for example, from 0.5 mm to 3.0 mm, especially from 1.0 mm to 2.8 mm. For example, the carrier layer can have a layer thickness of 0.05 mm to 0.2 mm, in particular 0.1 mm to 0.15 mm. In a further implementation in addition to the carrier layer, photo layer and barrier layer, the composite panel exhibits at least one intermediate layer, for example at least one additional adhesion layer, which is arranged between the carrier layer and the photo layer. Optionally, a protective layer may be provided on the mask material, in which the protective layer is adapted in particular to be removed prior to exposure and/or structuring of the mask material.

In a further implementation of the composite panel, the barrier layer exhibits a layer thickness of at most 100 µm, preferably at most 20 µm and further preferably at most 10 µm. High layer thicknesses even above 100 µm are particularly advantageous for the mechanical stability of the barrier layer. In principle, the choice of layer thickness is possible over a wide range. Important effects to consider are the influence of thickness on mechanical stability and optical properties. With small layer thicknesses of preferably at most 10 µm, a refraction effect of the incoming radiation, which is used to illuminate the photo layer, can be further reduced. This further enhances the quality and resolution of the resulting surface structure of the photo layer. The quality and resolution can be further improved if the barrier layer has a maximum thickness of at most 5 µm.

At least one mask material is arranged on the barrier layer. A mask material is used in particular for selective exposure of the photo layer. The mask material is particularly opaque in the wavelength range in which the photo layer can be structured. Thus, during an exposure, the sections of the photo layer that are not covered by a mask material are exposed, while the sections covered by the mask material are essentially not exposed. In particular, the mask material is arranged directly on the barrier layer, i.e. the mask material is in contact with the barrier layer.

The mask material can be formed as a layer, in particular as a continuous, flat layer, which in particular completely covers the photo layer and/or the barrier layer. The mask material is then intended for later structuring, for example. For example, the mask material includes a material that can be structured by means of electromagnetic radiation or consists of it, for example according to the principle of a photoresist.

The mask material can also have a structure for selective exposure of the photo layer. For example, the structure of the mask material is structured by selective exposure or selective development and selective removal. For the structuring of the mask material, which is achieved for example by a solution, the arrangement of the barrier layer according to the invention is also advantageous, as the effect of the solution on the photo layer is prevented. The mask material can also be applied in a structured manner, for example using a printing process.

The mask material s or consists of diazo compounds. Diazo compounds can change the properties of the mask material under the influence of electromagnetic radiation, so that the mask material can be structured by exposure and selectively removed. Corresponding diazo compounds, in particular with further coupling components, are known to the expert from the state of the art and described, for example, in Römpp, *Chemie Lexikon,* 7th edition, Franckh'sche Verlagshandlung (1973) especially under Lichtpausen and Diazoverbindungen. In particular, a mask material comprising diazo compounds is used which can be selectively detached with ammonia and/or water after selective exposure. For example, the mask material can be selectively exposed in the visible range, for example at a wavelength of approx. 405 nm, in order to influence the solubility of the mask material. A special example of a diazo compound is diazonaphthoquinone (DNQ).

In a further implementation, the mask material includes ink and/or wax. For example, the mask material is printed on, in which wax and/or ink can be used particularly reliably. In particular, the ink may be a UV-curable ink and/or pasty ink. Especially a combination of wax and UV-curable ink is advantageous as a mask material for printing.

In a further implementation of the composite panel, the composite panel is designed for use in the manufacture of a flexographic printing plate. Flexographic printing plates are used, for example, for printing on cardboard, paper, films, foils and/or laminates and are particularly suitable for large-scale production and printing on large workpieces. The flexible properties of flexographic printing plates can be adjusted, for example, by adjusting the carrier layer and the photo layer accordingly, for example by selecting the material and/or the layer thickness.

According to a second teaching of the present invention, the above-mentioned task is solved by a process for producing a letterpress plate using at least one composite panel, having a carrier layer, having at least one photo layer which can be structured in a wavelength range via electromagnetic radiation, in which the photo layer is arranged on the carrier layer, having a barrier layer, in which the barrier layer is arranged on the side of the photo layer opposite to the carrier layer, in which the barrier layer is substantially transparent in the wavelength range in which the photo layer is structurable, wherein at least one mask material is applied to the composite panel by lamination and the mask material is selectively structured, in which at least one mask material includes diazo compounds is used, wherein the photo layer is selectively exposed at least in the wavelength range in which the photo layer is structurable, and wherein the selectively exposed photo layer is selectively removed.

As already mentioned for the composite panel described above, the barrier layer improves the quality and resolution of the letterpress plate produced from the composite panel. The barrier layer remains on the photo layer during the exposure of the photo layer, in which the exposure is made possible in particular by the small layer thickness of at most 20 μm, in particular at most 10 μm, since refraction effects at the barrier layer may cause only minor quality losses. During the photochemical reaction of the photo layer triggered by the exposure, the influence of the surrounding atmosphere is significantly reduced through the barrier layer at the same time.

The application of mask material can be carried out using various methods or combinations of methods. For example, the mask material is laminated, calendered, sprayed on, printed on, laid on and/or manually arranged on the composite panel. At least one mask material is laminated. In particular, at least one mask material is applied by means of at least one carrier film or release film, in which the carrier film in particular is removed after application. It is also possible to apply several different mask materials in one or more successive and/or simultaneous process steps. The mask material can be structured with the application, for example by a selective application and/or after the application with further methods.

The selective structuring of the photo layer is carried out in particular by means of methods known from expertise, such as development and selective removal by chemical and/or mechanical methods after selective exposure. For example, the photo layer reacts positively to an exposure, so that the exposed sections can be selectively detached. For example, the photo layer reacts negatively to an exposure, so that the unexposed sections can be selectively removed.

In a further embodiment at least one mask material is applied as a layer. In particular, this is a continuous, flat layer which can then be structured to allow selective exposure of the photo layer.

In particular, the mask material is designed to change its properties by exposure to electromagnetic radiation. A structuring of the mask material can be achieved in an embodiment by selectively exposing the mask material to light and then selectively removing it. Removal of the mask material can, for example, be carried out by chemical treatment and/or mechanical treatment. For example, the mask material, the solubility of which has been selectively adjusted by exposure, is selectively removed with a solvent, particularly by mechanical means.

At least one mask material comprising diazo compounds is used. As already explained for the composite panel described above, mask materials based on diazo compounds provide a process-reliable possibility for providing a mask for exposing the photo layer. In particular, a mask material comprising diazo compounds is used, which is selectively dissolved with ammonia and/or water after selective exposure. For example, the mask material can be selectively exposed in the visible range, for example at a wavelength of 405 nm, in order to influence the solubility of the mask material.

In a further embodiment of the process at least one mask material is printed on. The printing of the mask material allows a simple and high quality application of the mask material. Likewise, the at least one mask material can already be structured by printing, so that further steps for structuring the mask material can be at least partially or completely omitted.

In one embodiment of the process, the mask material includes or consists of ink and/or wax. As already explained for the printing plate described above, ink and/or wax as mask material is particularly advantageous for printing on the mask material.

In the next embodiment of the process, at least one panel made of the composite material described above is attached in sections to a letterpress carrier. Especially for large letterpress forms, such as flexographic printing plates, which are used to print on corrugated board and in which large areas remain unprinted, full-surface letterpress plates are too cost-intensive. By this embodiment of the process reproducible and extremely precise alignment of the letterpress plate against a letterpress carrier is ensured, so that, for example, large-area objects can be printed with high accuracy.

On the one hand, this is due to the fact that the exposure of the letterpress plate takes place only after the letterpress plate has been attached to the letterpress carrier, in which the mask material for exposure can be aligned very precisely with the letterpress carrier by simple means. For example, a register is used for alignment. The mask material can be applied by printing, for example.

In a further embodiment of the process, the sections on the letterpress carrier that remain free when fastening the at least one composite panel are covered with at least one leveling layer before the mask material is applied. This leveling layer ensures that the mask material, for example as a layer and/or film, can be applied completely flat over the entire surface of the letterpress carrier and that no distortions or displacements are caused by sagging or bending. The letterpress plates masked in this way are exposed, developed and the photo layer selectively removed.

According to a third teaching of the present invention, the above-mentioned task is solved by a process for the manufacture of a composite panel in accordance with the invention, in which a carrier layer, at least one photo layer, one barrier layer and at least one mask material are applied to one another, in which the photo layer is arranged on the carrier layer, in which the photo layer is structurable via electromagnetic radiation in a wavelength range, in which the barrier layer is arranged on the side of the photo layer opposite to the carrier layer, in which the barrier layer is substantially transparent in the wavelength range in which the photo layer is patternable, in which the mask material includes diazo compounds and in which the application includes lamination.

A combination of at least one mask material comprising diazo compounds in combination with laminating for application has proved to be particularly process-safe and economical for the manufacture of the composite panel according to the invention for letterpress forms.

The carrier layer, photo layer, barrier layer and the mask material can be placed together in a common process step. Likewise, individual layers can first be placed on top of each other, for example in the form of a composite material, and then combined to form the composite panel. This may involve laminating individual or all steps of the application. Other possible methods for applying the layers are, for example, calendering, spraying, printing, applying and/or manual arrangement, which can be combined in particular with laminating. It is also possible to provide and apply further layers, for example at least one additional adhesion layer and/or at least one protective layer.

In a embodiment of the process according to the third teaching, the barrier layer is applied together with the mask material on the side of the photo layer opposite to the carrier layer. This further improves the process by facilitating the application of the mask material. In particular, there is no need for an additional carrier foil or release foil, which should enable the application of the mask material and which would have to be removed afterwards. Rather, the barrier layer can serve both as a carrier film to facilitate the application of the mask material and—as described above for the composite panel—in particular to provide a diffusion barrier layer in the structuring of the composite panel for the production of a letterpress forms. Accordingly, no additional process steps are required in the manufacture of the composite panel, since no additional carrier layer has to be provided and removed again after application. This also makes the process more cost-effective.

In a further embodiment, the mask material with the barrier layer is provided as a composite material before application. A composite material is understood in particular to mean that the mask material and barrier layer are firmly bonded to each other, for example by adhesion and/or by material bonding. For example, the mask material is applied to the barrier layer by lamination. In particular, the composite material is applied by lamination.

According to a fourth teaching of the present invention, the above-mentioned task is solved by using a composite material, the composite material comprising: a barrier layer having a layer thickness of preferably at most 20 µm, in which the barrier layer is substantially transparent in a wavelength range suitable for structuring a photo layer; and a mask material comprising diazo compounds; in which the composite material is used in a composite panel for a letterpress plate.

As already described for the process according to the third teaching, the composite material can facilitate the application of the mask material, in which the barrier layer simultaneously fulfills the function of a carrier film for the mask material in the manufacture of the composite panel and the function of a diffusion barrier for the manufacture of the letterpress forms.

In an embodiment of use, the composite material is used in a composite panel for a flexographic printing plate or the composite material is used in the manufacture of a flexographic printing plate.

In particular, the prior or subsequent description of process steps in accordance with preferred procedural forms should also reveal corresponding designs of a composite panel. Likewise, the disclosure of embodiments of the composite panel shall reveal its use or production in procedural steps of the proceedings. In addition, the description of the composite panel and the procedures should also reveal possible forms of use.

BRIEF DESCRIPTION OF THE DRAWINGS

For further information on the embodiment of the composite panel, the processes and its use, refer to the following description of examples of embodiment on the basis of the drawing. In the drawings is shown.

DESCRIPTION OF THE INVENTION

Figure 1:
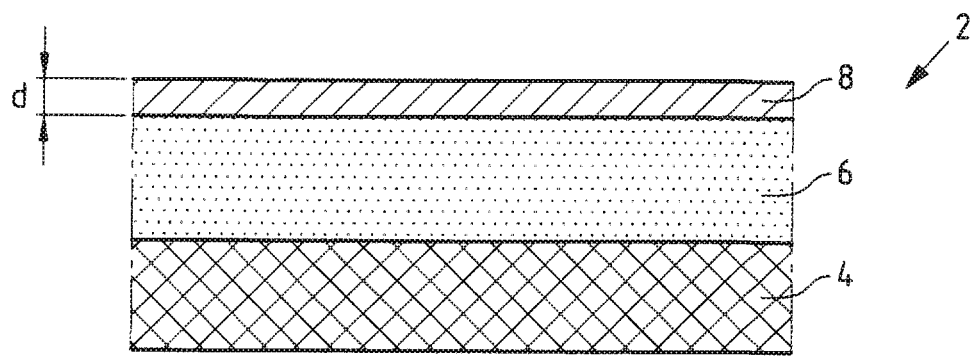
FIG. 1 a composite panel.

FIG. 1 shows a composite panel 2. The composite panel 2 has a carrier layer 4 and at least one photo layer 6, in which the photo layer 6 is arranged on the carrier layer 4. The photo layer 6 can be arranged directly on the carrier layer 4 or optionally at least one intermediate layer is provided, for example an additional adhesion layer (not shown).

The photo layer 6 can be structured via electromagnetic radiation in a wavelength range. For example, photo layer 6 is based on photopolymers, in which the photo layer is designed to change certain properties of the photo layer, in particular the solubility and/or the curing properties, in the ultraviolet and/or violet wavelength range, i.e. for example within a range from 100 nm to 380 nm or within a range from 380 nm to 425 nm.

In particular, the mechanical properties of the composite panel 2 can be adjusted via the design of the carrier layer 4. For example, carrier layer 4 is based on polyethylene terephthalate and/or has a thickness of 0.05 mm to 0.2 mm, in particular 0.1 mm to 0.15 mm. The total thickness of composite panel 2, for example, is from 0.5 mm to 3.0 mm. In particular, composite panel 2 is designed for the production of a flexographic printing plate.

A barrier layer 8 is provided on the side of the photo layer 6 opposite to the carrier layer 4, in which the barrier layer 8 has a layer thickness d of at most 100 µm, preferably at most 20 µm, in particular of at most 10 µm or of at most 5 µm and in which the barrier layer 8 is substantially transparent in the wavelength range in which the photo layer 4 can be structured. For example, the barrier layer 8 is essentially transparent in the ultraviolet and/or violet wavelength range, i.e. for example within a range of 100 nm to 380 nm or within a range of 380 nm to 425 nm, i.e. it allows a large part of the radiation intensity to pass through in this wavelength range. In particular, at least 50%, preferably at least 75%, further preferably at least 95% of the incident intensity can penetrate the barrier layer 8.

The barrier layer 8 is arranged directly on the photo layer 6 and is thus in contact with the photo layer 6. The barrier layer 8 provides a diffusion barrier for the photo layer 6 against the surrounding atmosphere, while at the same time an exposure of the photo layer 6 through the barrier layer 8 is possible due to the low layer thickness d and the transparent properties of the barrier layer 8. The barrier layer 8, for example, is based on at least one polymer. The barrier layer 8 includes or consists, for example, of polyethylene terephthalate.

It has been found that the quality and resolution of the letterpress plate made from the composite panel 2 can be improved via the barrier layer 8. The barrier layer 8 remains on the photo layer 6 when the photo layer 6 is exposed, as also explained in connection with the following figures. Especially due to the small layer thickness of less than 20 µm, especially less than 10 µm or 5 µm, refraction effects at the barrier layer 8 are curbed, so that only little or no loss of quality is caused by the barrier layer 8. At the same time, the influence of the surrounding atmosphere through the barrier layer 8 is significantly reduced, which leads to a significant increase in the quality of the structured surface of the photo layer 6.

In the following, embodiment examples of the design of the composite panel 2 are explained using FIGS. 2 and 3, and at the same time an embodiment example of the of the process in accordance with the invention is described. For the sake of clarity, the same reference signs as in FIG. 1 are used in the following figures for corresponding elements.

Figure 2:
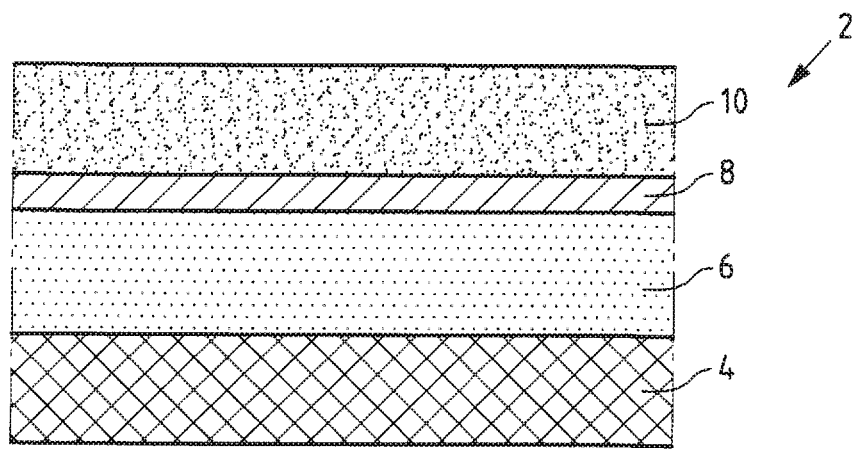
FIG. 2 an embodiment example of a composite panel.

FIG. 2 shows an embodiment example of a composite panel 2 in which at least one mask material 10 is arranged on the barrier layer 8. The mask material 10 is formed as a layer and covers the entire surface of the photo layer. The mask material is laminated. The mask material 10 can be structured, for example by removing the mask material 10 section by section and/or changing the properties section by section.

In particular, mask material 10 is designed to change its properties under the influence of electromagnetic radiation. The advantage of the composite panel 2 is that the photo layer 6 is shielded from the surrounding atmosphere by the barrier layer 8 during exposure. The exposure of the mask material 10 thus only negligibly affects the photo layer.

The mask material includes diazo compounds, which can be selectively exposed and removed as known from the state of the art. For example, corresponding compounds with a wavelength of 405 nm can be exposed and/or dissolved with a solution containing ammonia and/or water. In the use of a solution for structuring the mask material 10, the barrier layer 8 advantageously acts to contain the action of the solution, for example a solution comprising ammonia, on the photo layer 6.

Figure 3:
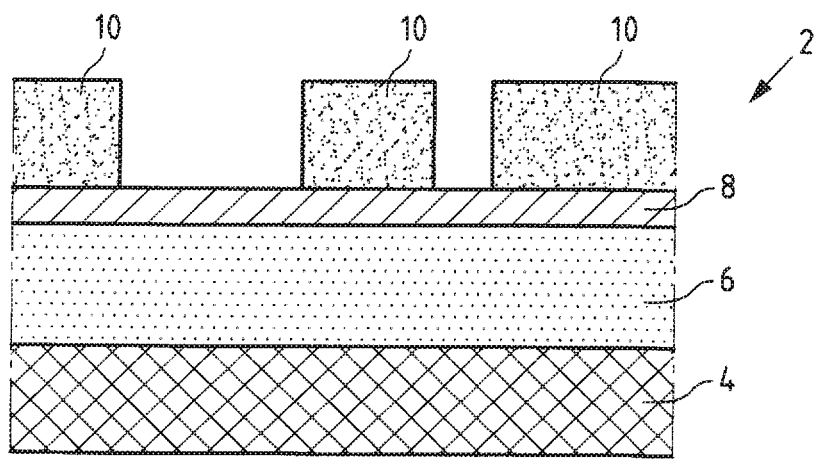
FIG. 3 another embodiment example of a composite panel.

FIG. 3 shows another embodiment example of a composite panel 2, in which the mask material 10 has a structure for selectively exposing the photo layer 6. The structure is shown here in the form of recesses between individual sections of the mask material 10.

The structure of the mask material 10 can, for example, be achieved by selectively removing the mask material 10 as described above for FIG. 2. The mask material 10 is based on diazo compounds and is structured by exposure.

Alternatively or cumulatively, the mask material 10 can also be structured by selectively applying the mask material 10. For example, mask material 10 is selectively printed on and is based on ink and/or wax, preferably a combination of UV-curable ink and wax.

Figure 4:
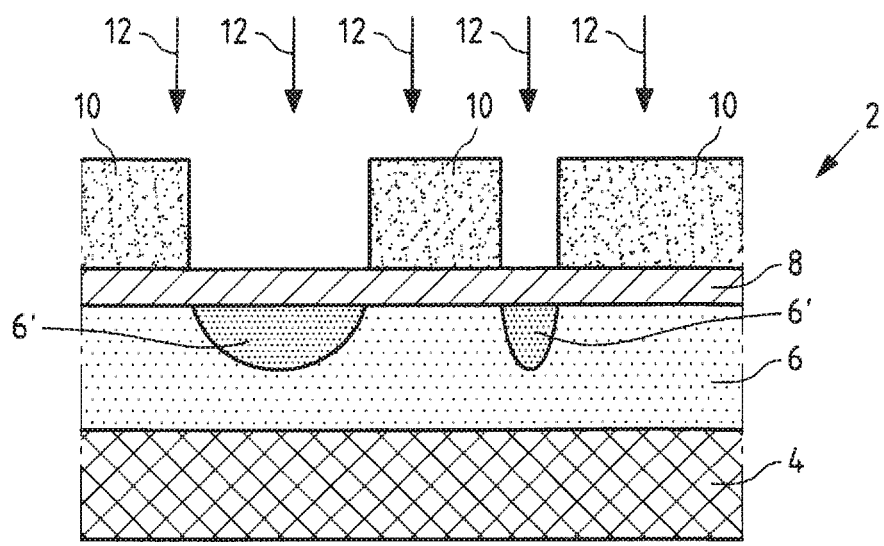
FIG. 4 the embodiment example from FIG. 3 with a selective exposure of the photo layer, FIG. 5a,b two embodiments of a letterpress forms made from the composite panel and FIG. 6 another embodiment example of a composite panel on a letterpress carrier.

FIG. 4 now shows the embodiment example of the composite panel 2 from FIG. 3 with a selective exposure of the photo layer 6, in which electromagnetic radiation 12 acts on the composite panel 2 at least in the wavelength range in which the photo layer 6 can be structured. The barrier layer 8 is essentially transparent to the radiation 12, so that the radiation 12 acts selectively on sections 6' of the photo layer 6 due to the coverage by the mask material 10. The advantage of the composite panel 2 is that the photo layer 6 is shielded from the surrounding atmosphere by the barrier layer 8 and at the same time only slight refractive effects occur at the barrier layer 8. The exposure of the photo layer 6 can be done with high resolution and high quality.

The selectively exposed photo layer 6 can be selectively removed. In the case of photopolymers, for example, the usual process steps for the development and selective removal of photo layer 6 can be carried out. In particular, the mask material 10 and/or the barrier layer 8 are removed before or after the treatment.

Figure 5A:
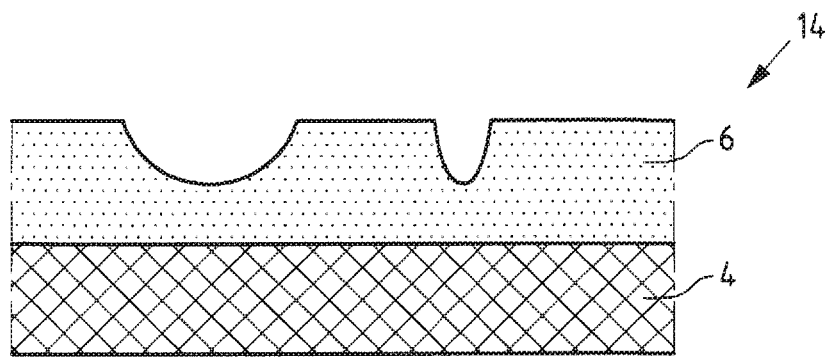

FIG. 5a, b shows two embodiments of a letterpress form made of composite panel 2, which are designed as flexographic printing forms 14. The flexographic printing form 14 shown in FIG. 5a, for example, is derived from the selectively exposed composite panel 2 shown in FIG. 4, in which the photo layer 6 reacts particularly positively to an exposure. For example, the solubility of the exposed sections 6' is increased, which results in recesses in the corresponding areas when they are detached.

Figure 5B:
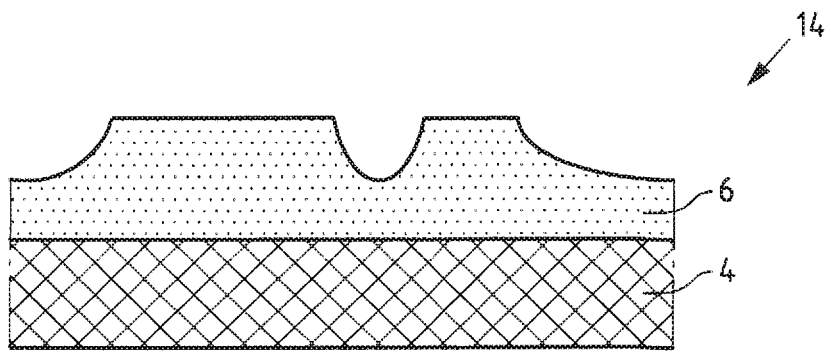

FIG. 5b shows a flexographic printing plate 14 with a negative reaction of the photo layer 6. For example, the solubility of the exposed sections 6' is reduced, resulting in recesses in the unexposed sections when they are detached.

Figure 6:
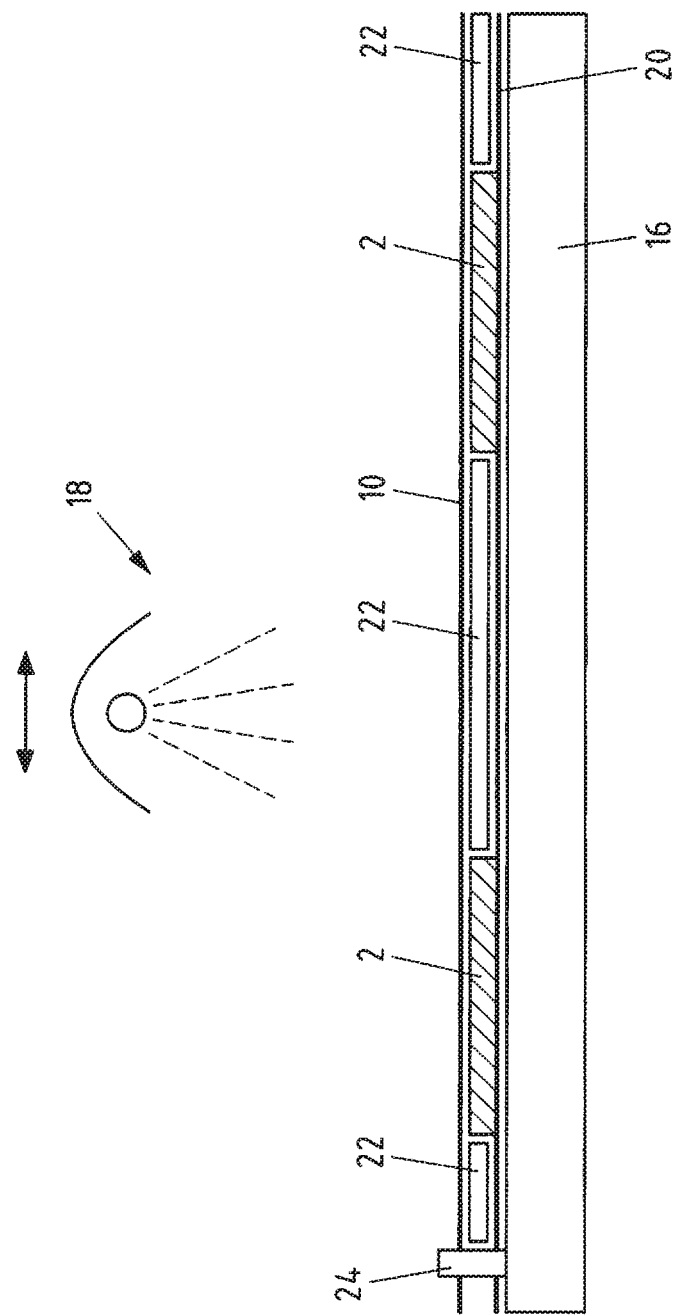

FIG. 6 shows another example of a composite panel 2 on a letterpress carrier. Above an bench 16 an exposure unit 18 is provided, which is sketched as a linear light source in the example shown, which can be moved relative to the bench 16 for complete exposure.

Composite panels 2 are attached to the flexographic printing carrier 20. The mask material 10 can be applied by printing, for example. In FIG. 6, however, a leveling layer 22 is provided in the free sections on the flexographic printing support 20, so that mask material 10 can be applied to the composite panels 2 and the leveling layer 22. The arrangement of the leveling layer 22 ensures that the mask material 10 does not sag or cause waves in the areas covered by the leveling layer 22. A particularly precise alignment of the composite panels 2 can be ensured in a particularly simple manner, in particular by using a register 24.

As known from the state of the art, the at least partially unexposed composite plates 2 are preferably cut using a cutting plotter. It is also advisable to cut the leveling layer 22 with the aid of a cutting plotter known per se. Various cost-effective materials can be used as leveling layer 22. Preferably, these have a thickness that essentially matches that of the composite panels 2. Materials such as cardboard or elastic materials such as rubber panels or polymer panels can be considered.

In an embodiment example of the method of manufacturing a composite panel, a carrier layer, at least one photo layer, one barrier layer and at least one mask material are applied to one another.

The barrier layer is applied together with the mask material on the side of the photo layer opposite to the carrier layer. For this purpose, a composite material comprising mask material and barrier layer is first provided, in which the mask material and the barrier layer are bonded to one another by adhesion and/or by a material bonding. For example, the mask material is applied to the barrier layer by lamination.

The composite material comprising mask material and barrier layer is used to provide a composite panel for making a letterpress form. The composite material is applied to a carrier layer and a photo layer. The application of the composite material involves laminating. In particular, a further composite material comprising carrier layer and photo layer is provided, to which the composite material comprising mask material and barrier layer is applied, in particular by lamination.

By using the composite material comprising mask material and barrier layer, a particularly economical process for manufacturing the composite panel can be carried out. The need for an additional carrier film or release film for applying the mask material is eliminated with the barrier layer, which at the same time provides a diffusion barrier layer for the subsequent structuring of the composite panel to produce a letterpress forms.

The invention claimed is:

1. A method for manufacturing a letterpress plate using at least one composite panel, the method comprising the following steps:
    providing a carrier layer;
    arranging at least one photo layer on the carrier layer, in which the at least one photo layer is structurable via electromagnetic radiation in a wavelength range;
    arranging a barrier layer on a side of the at least one photo layer opposite to the carrier layer;
    applying at least one mask material to the composite panel by lamination;
    selectively structuring the at least one mask material;
    selectively exposing the at least one mask material;
    selectively removing the at least one mask material;
    influencing the solubility of the at least one mask material by selectively exposing the at least one mask material to a visible range;
    structuring the at least one mask material using a solution;
    selectively exposing the at least one photo layer at least in the wavelength range; and
    removing the selectively exposed at least one photo layer,
    wherein the barrier layer has a layer thickness of at most 20 μm,
    wherein the barrier layer is essentially transparent in the wavelength range, in which the at least one photo layer is structurable via electromagnetic radiation, and
    wherein the at least one mask material comprises diazo compounds.

2. The method according to claim 1, further comprising the step of applying the at least one mask material as a layer.

3. The method according to claim 1, further comprising the step of fastening the at least one composite panel in sections on a letterpress carrier.

4. The method according to claim 3, wherein portions on the letterpress carrier are configured to remain free during the fastening of the at least one composite panel and are covered with at least one compensating layer prior to applying the at least one mask material.

5. A method of manufacturing of a composite panel for use in the manufacture of a letterpress plate, comprising the steps of:
    applying a carrier layer, at least one photo layer, a barrier layer and at least one mask material to one another;
    arranging the at least one photo layer on the carrier layer, in which the at least one photo layer is structurable via electromagnetic radiation in a wavelength range;
    arranging the barrier layer on the side of the at least one photo layer opposite to the carrier layer; and
    laminating the at least one mask material onto the barrier layer,
    wherein the barrier layer is essentially transparent in the wavelength range in which the at least one photo layer is structurable,
    wherein the at least one mask material comprises diazo compounds and has a solubility that can be influenced by selective exposure in the visible range
    wherein applying the at least one mask material involves laminating, and
    wherein the barrier layer is applied together with the at least one mask material to the side of the at least one photo layer opposite to the carrier layer.

6. The method according to claim 5, wherein the at least one mask material is provided with the barrier layer as a composite material and the composite material is applied by lamination.

* * * * *